July 28, 1953 C. T. DALY 2,647,176

ELECTRIC AMPLIFIER WITH AUTOMATIC GAIN CONTROL

Filed June 6, 1951 2 Sheets-Sheet 1

Inventor
CHARLES T. DALY
By [signature]
Attorney

Inventor
CHARLES T. DALY
By R P Morris
Attorney

Patented July 28, 1953 2,647,176

UNITED STATES PATENT OFFICE 2,647,176

ELECTRIC AMPLIFIER WITH AUTOMATIC GAIN CONTROL

Charles Trevor Daly, London, England, assignor to International Standard Electric Corporation, New York, N. Y., a corporation of Delaware Application June 6, 1951, Serial No. 230,203
In Great Britain June 16, 1950

5 Claims. (Cl. 179—171)

Figure 1:
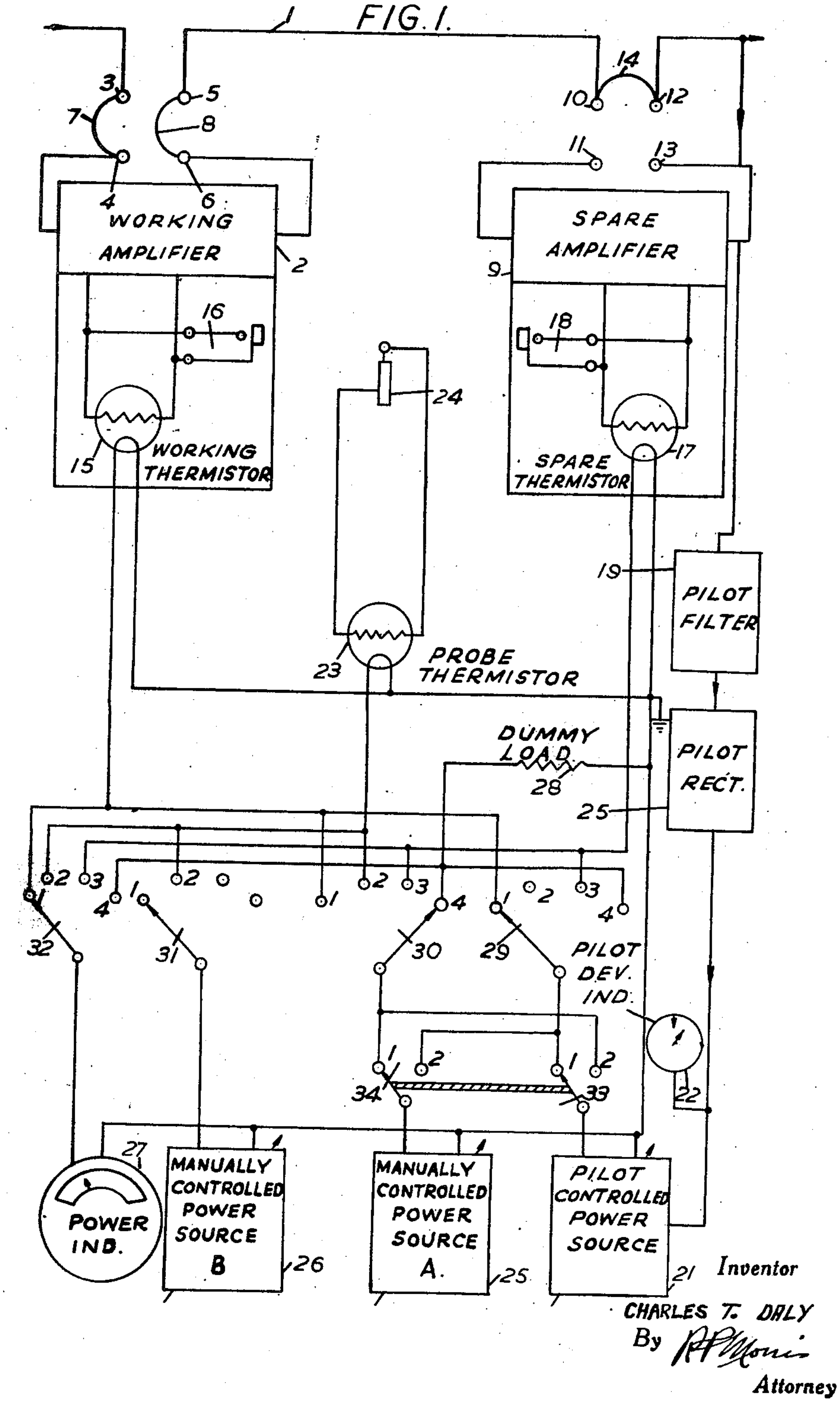

The present invention relates to electric amplifiers with automatic gain control arrangements and is concerned with the means for replacing a working amplifier by a spare amplifier.

In multi-channel electric carrier current communication systems, it is desirable that any working amplifier should be capable of replacement by a spare amplifier to enable it to be tested. Since any amplifier will usually be transmitting a large number of channels, it is essential that it should be possible to replace by a spare amplifier with the minimum of disturbance. In systems where automatic gain control is employed, a spare amplifier cannot generally be connected directly instead of the working amplifier without producing a serious variation in signal level, because its gain will not have the correct value. While the automatic control arrangements will eventually adjust the gain of the amplifier to the proper value when it is in circuit, in the meanwhile a large transient will have occurred which may amount nearly to +10 decibels and which will affect all the other amplifiers on the circuit and may take appreciable time to die out.

The principal object of the present invention is to overcome this difficulty by ensuring that when the spare amplifier is connected to replace the working amplifier it will already have been adjusted to produce the approximately proper gain, so that no large transient can occur.

This object is achieved according to the invention by providing an electric carrier current communication system comprising a circuit in which there is connected a working amplifier, the gain of which is automatically adjusted by a pilot regulator including a power source controlled by a pilot current transmitted with the signal currents, and arranged to supply heating current to a thermistor which will be called the "working thermistor," forming part of a gain control network in the amplifier, a spare amplifier of similar type to the working amplifier and including a similar gain control network and a similar thermistor, called the "spare thermistor," a manually adjustable power source arranged to supply heating current to the spare thermistor, means for switching the spare amplifier into the circuit in place of the working amplifier, and means for replacing the manually controlled source by the pilot controlled source as a source of heating current for the spare thermistor.

The invention also provides an electric carrier current communication system comprising a circuit in which there is connected a working amplifier, the gain of which is automatically adjusted by a pilot regulator including a power source controlled by a pilot current transmitted with the signal currents and arranged to supply heating current to a working thermistor forming part of a gain control network in the amplifier, a spare amplifier of similar type to the working amplifier and including a similar gain control network and a spare thermistor, a probe thermistor, means for connecting the probe thermistor in parallel separately with each of the other thermistors, two manually adjustable power sources, means for connecting the spare amplifier in the circuit in place of the working amplifier, and switching means permitting each thermistor to be supplied with heating current from different ones of the three power sources at different times.

Figure 2:
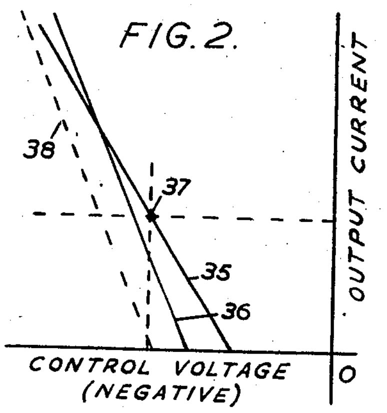
Figure 3:
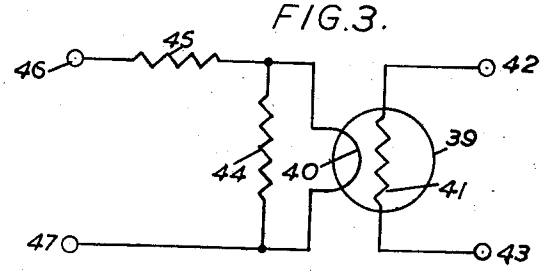

The invention will be described with reference to the accompanying drawings, in which Fig. 1 shows a block schematic circuit diagram of the preferred embodiment of the invention; Fig. 2 shows characteristic curves; and Fig. 3 shows a thermistor circuit used in a simplified form of the invention.

In carrier current communication systems with automatic gain control arrangements, the gain of any amplifier is commonly controlled by a network including a thermistor whose resistance is controlled by a heating current depending on the level of a pilot current which is transmitted with the signal currents, the level being measured at the output of the amplifier. The gain of the amplifier necessary to produce a given output level depends on the attenuation of the preceding section of the transmission circuit, and the temperature of the thermistor is automatically adjusted by a control voltage derived from the pilot current so that the proper gain is produced. Usually it is not known what the value of this gain is, and furthermore, the usual commercial variations in thermistors are such that the temperature required to produce a given resistance is not precisely known. It follows that in order to pre-adjust the gain of a spare amplifier it is necessary effectively to determine (a) the gain of the working amplifier and (b) the temperature of the thermistor in the spare amplifier necessary to produce this gain.

In the preferred process of adjustment according to the invention which will be described in detail, an auxiliary or probe thermistor is used which can be plugged in parallel with the normal working thermistor in any amplifier and which is used to determine the two conditions (a) and (b) indirectly by finding what power must be supplied to heat the thermistor in the spare amplifier in order that this amplifier may have substantially the same gain as the working amplifier. This power so determined is then supplied to the thermistor in the spare amplifier, and the latter can then be substituted for the working amplifier without producing any large change in signal level. Actually, it is found that in practice this process can be carried out without appreciably interfering with any of the channels, and without producing changes in signal level of more than about half a decibel.

Referring now to Fig. 1, a communication circuit 1 is provided with a normal working amplifier 2 connected therein by means of two pairs of sockets 3, 4 and 5, 6 connected by U-links 7, 8. A spare amplifier 9 may be substituted for the working amplifier 2, a set of similar sockets 10, 11, 12, 13 being provided. A U-link 14 connects sockets 10 and 12. It should be understood that this arrangement of U-links and sockets is only intended to represent some suitable connecting scheme which will be alluded to later.

The gain of the working amplifier 2 is adjusted by means of a thermistor 15 (called the working thermistor) the resistance element of which forms part of a gain adjusting network (not shown) of conventional type, and supposed to be contained in the amplifier 2. A jack 16 is shown with its tip and ring conductors connected to the terminals of the resistance element of the thermistor. The spare amplifier 9 is provided with a similar thermistor 17 (called the spare thermistor) and jack 18.

According to the usual practice, a pilot current of some suitable frequency is transmitted over circuit 1 with the signal currents, and is selected at the output of the amplifier by a pilot filter 19, and is rectified by the pilot rectifier 20 to produce a controlling unidirectional voltage whose magnitude varies with the level of the pilot current at the output of the amplifier. This voltage is applied to control a power source 21 which may consist of an oscillator generating a relatively low frequency wave, the amplitude of which is controlled by the voltage at the output of the pilot rectifier 20. The low frequency wave is supplied from the source 21 through switches (to be described in detail later) to the heating coil of this working thermistor 15. A direct current voltmeter 22 is connected at the output of the rectifier 20 to indicate the deviation of the pilot level from the specified value. The elements 19 to 22 comprise what will be called the pilot regulator.

The arrangements which have been described so far are the arrangements which are commonly provided for automatically controlling the gain of the working amplifier 2 in order to maintain the pilot current at the specified level. According to the invention, in order to determine the power necessary to supply to the heating coil of the spare thermistor 17 so that the spare amplifier 9 may give substantially the same gain as the working amplifier 2 the following additional apparatus is provided:

1. An auxiliary or probe thermistor 23 of the same type as the thermistors 15 and 17, the resistance element of which is connected to the conductors of a plug 24 designed to fit the jacks 16 and 18;

2. Two manually controlled power sources 25, 26 (designated A and B). Such sources could each consist of a suitable transformer supplied with 50 cycle current from the mains, and provided with a potentiometer or like device for adjusting the power supplied to the load. If desired, the sources could be similar to 21 except that they would be controlled by a unidirectional voltage which is adjustable by hand;

3. A power indicating instrument 27 which may be a high resistance alternating current voltmeter;

4. A dummy load 28 whose resistance is equal to the resistance of the heating coils of the thermistors;

5. A switching system which may be arranged in any desired manner to carry out the operations represented in the simplest form by six switches 29 to 34.

It will be undertsood that the plug 24 and the jacks 16 and 18 are intended to represent any equivalent connecting system taking a suitable mechanical form; for example, probably a coaxial plug and jack system would be necessary in view of the relatively high carrier frequencies which may be involved.

The switches 29, 30, 31 and 32 correspond respectively to the three power sources 21, 25, 26, and the power indicator 27, and have contacts numbered 1 to 4, which in each switch correspond respectively to the working thermistor 15, the probe thermistor 23, the spare thermistor 17 and the dummy load 28. Switch 31 actually has only one working contact (No. 2) corresponding to the probe thermistor 23. In the case of switch 29, contact No. 2 is not used. The switches 33 and 34 are mechanically connected and are used for the purpose of interchanging the two sources 21 and 25. All the switches are shown in the positions which they would occupy under normal working conditions. It will be seen that the pilot controlled power source 21 is connected over switches 33 and 29 to the heating coil of the working thermistor 15; manual power source A (25) is connected over switches 34 and 30 to the dummy load 28; manual power source B (26) is out of circuit; and the power indicator 27 is connected through switch 32 to measure the power supplied to the heating coil of the working thermistor 15.

The procedure which is adopted to get the spare thermistor 17 to the proper temperature before replacing the working amplifier 2 by the spare amplifier 9 may be summarised in general terms as follows. Certain points of detail which will be explained later are omitted in the interest of clarity.

*First.*—The probe thermistor 23 is connected in parallel with the working thermistor 15 by inserting the plug 24 in the jack 16. Since the probe thermistor is cold, its resistance will be very large compared with that of the working thermistor 15, which is hot, so that only an extremely slight change in gain is produced, which is at once corrected by the pilot regulator. The power supplied to the working thermistor 15 is measured, and the power source A (25) is set to supply this power to a dummy load. Then the power source A (25) is substituted for the pilot controlled source 21 in heating the working thermistor 15. No change in gain will be produced thereby. The output of the pilot source 21 is then adjusted by hand to zero (the control voltage at the output of the pilot rectifier 20 of course still having the value corresponding to the specified pilot output level). The output of the power source A (25) is then reduced slowly, thus increasing the resistance of the working thermistor 15. Meanwhile, the pilot regulator is maintaining the pilot level constant by increasing the power supplied by the source 21 to the probe thermistor 23. This process is continued until the power supplied by the source A (25) is just reduced to zero. The working thermistor 15 is now cold, and the probe thermistor 23 is maintaining the gain at the proper value. Thus, by connecting the power indicator 27 across the heating coil of the probe thermistor 23, the power necessary to produce the proper resistance for the probe thermistor 23 is determined.

By reversing these operations, control is restored to the working thermistor 15 and the probe thermistor 23 is then disconnected by removing the plug 24 from the jack 16. Next, the probe thermistor 23 is supplied from manual source B (26) with the power which has just been determined, so that it will have the proper resistance to produce the desired gain. The probe thermistor 23 is now connected in parallel with the spare thermistor 17 in the spare amplifier 9 by inserting the plug 24 in the jack 18.

The manually controlled power source A (25) is now adjusted on the dummy load 28 to give the power necessary to heat the working thermistor 15 to the proper temperature. By operating the reversing switches 33 and 34, the pilot controlled source 21 is replaced by the manual source A (25) in controlling the working thermistor 15, but the gain of the working amplifier 2 will be substantially unaltered by the change. Now both amplifiers are on manual control and both are giving substantially the same gain, so that the working amplifier 2 may now be replaced by the spare amplifier 9 by transferring the U-links 7, 8 and 14 to join the socket pairs 10—11, 12—13 and 3—5 respectively. It is of course, not permissible to interrupt the circuit for more than a small fraction of a millisecond, and so it will be understood that the operation illustrated by these sockets and U-links should be carried out by suitable switching means designed on known principles to meet this requirement. The particular arrangement employed is immaterial as regards the present invention.

Now that the spare amplifier 9 is producing the correct gain, the output of the pilot controlled power source 21 is again adjusted to zero and it may then be connected to the heating coil of the spare thermistor 17 without producing any change. The next step is slowly to reduce the power supplied by manual source B (26) to the probe thermistor 23. The pilot regulator will correspondingly increase the power supplied to the spare thermistor 17 until the probe thermistor 23 is again cold after which it may be disconnected by removing the plug 24 from the jack 18 without producing any appreciable change in gain. The spare amplifier 9 is thus now connected into the circuit 1 under control of the pilot current.

By repeating this process (mutatis mutandis), the working amplifier may be put back into the circuit after it has been tested.

The process which has been described in general terms will presently be explained in detail. It is however desirable first to describe briefly the power source 21.

This source is an improved form of the control oscillator described in U. S. patent specification No. 2,269,408. In this type of oscillator, the amplitude of the oscillations varies linearly with a negative control voltage which is applied to the control grid of the oscillating valve, and which is derived by rectification from the pilot current.

In the improved form of this oscillator employed for the source 21, the negative control voltage is supplemented by two additional bias voltages, namely:

(1) A fixed but adjustable positive bias voltage, and (2) A negative feedback voltage obtained by rectifying the generated oscillations, which varies in the opposite direction to the control voltage.

In an oscillator of this kind the control ratio (which may be defined as the ratio of the change in amplifier gain to the change in the control voltage which produces the gain change) may be increased by increasing the effective attenuation of the negative feedback path, for which provision should be made.

Fig. 2 shows the control characteristics of the oscillator. The abscissae represent the negative control voltages derived from the pilot current and the ordinates represent the corresponding output currents which are applied to heat the gain controlling thermistor in the amplifier. The line 35 represents the normal control characteristic, and its slope is proportional to the control ratio. When the control ratio is increased by adjustment of the feedback attenuation, the slope will be increased and the new characteristic will be represented by the line 36, which generally does not intersect the line 35 at the point 37, the ordinate of which corresponds to the output current which produces the gain necessary to provide the specified output pilot level.

As will be mentioned later, a further adjustment will be required, which is to increase the sensitivity of control slightly so that when the control voltage corresponding to the specified output pilot level is applied, the output current is zero instead of the value corresponding to the point 37. This is done by reducing slightly the positive bias voltage (1) referred to above. The effect is to shift the characteristic line 36 to the left so that it occupies the position of the dotted line 38 which passed through the foot of the ordinate of the point 37. It follows that when this adjustment has been made, the pilot output level will be automatically regulated at a slightly lower level than the specified level, the difference being that corresponding to the horizontal difference between the point 37 and the line 38. This difference is less when the control ratio corresponding to the line 36 is high, and so the latter should be adjusted as described above so that the change in pilot level is small enough to be disregarded; for example, the change in pilot level should probably not exceed 0.2 decibel.

It will be understood that this change in pilot level is only a temporary change which occurs during the process of replacing one amplifier by the other, and the pilot level is restored to normal before the process is completed.

The process of replacing the working amplifier by the spare amplifier will now be explained in detail, starting with the normal condition in which the switches are in the positions shown in Fig. 1.

1. Plug 24 into 16, thus connecting the probe thermistor 23 in parallel with the working thermistor 15. An inappreciable change in the pilot level will be produced, which however will be at once corrected by the pilot regulator. Note the reading $x$ of the indicator 27. This measures the power supplied to the working thermistor 15.

2. Set switch 32 in position 4 and adjust the manual source A (25) to give the reading $x$ on the indicator 27. Both are at this stage connected to the dummy load 28.

3. Operate switches 33 and 34 to position 2 to interchange the sources 21 and 25. The thermistor 15 is now being supplied with the proper heating current by the manual source A (25) instead of by the pilot-controlled source 21, which is now connected to the dummy load 28. The switch 32 being in position 4, the indicator 27 is connected across the dummy load 28.

4. Increase the control ratio of the pilot source 21, and increase the sensitivity of control until the output as shown by the indicator 27 is zero. These operations are carried out in the manner already explained. These changes do not affect the pilot level, since the gain of the amplifier 2 is maintained at the proper value by the manual control source A (25).

5. Operate switches 30 and 32 in position 2 in each case. Since the switches 33 and 34 have been operated to position 2, this will connect the pilot controlled source 21 (which is producing zero output) and the indicator 27 to the heating coil of the probe thermistor 23. The power output of the manual source A (25) which is heating the working thermistor 15 should now be slowly reduced to zero. The pilot source 21 will meanwhile heat the probe thermistor 23 to compensate for the changes in the temperature of the working thermistor 15, and the gain of the amplifier 2 will eventually be stabilised at a value such that the pilot output level is about 0.2 decibel below the specified value, on account of the change in sensitivity of the control as already explained. If the reduction to zero of the power supplied by the manual source A is sufficiently slow, the effect will be a slow reduction in pilot level by about 0.2 decibel, the effect of which will be practically negligible, and will be effectively corrected at the next amplifier in the circuit.

The working thermistor 15 is now cold, and the gain is controlled by the probe thermistor 23. The reading $y$ of the indicator 27 should be noted. This measures the power which it is necessary to supply to the probe thermistor 23 to produce a gain which is 0.2 decibel below the value necessary to produce the specified pilot output level.

6. Operate switch 32 to position 1. This reconnects the indicator 27 to the heating coil of the working thermistor 15. Now slowly readjust the manual power source A to produce the reading $x$. This causes the output of the pilot source 31 supplying the probe thermistor to be reduced again to zero, and restores the gain of the amplifier 2 so that the pilot output level returns to the specified value. The probe thermistor 23 is again cold.

7. Transfer the plug 24 from the jack 16 to the jack 18. This connects the probe thermistor 23 in parallel with the spare thermistor 17. A very slight change in gain of the working amplifier 2 will be produced on removal of the probe thermistor. Operate switches 31 and 32 to position 2. This connects the manual source B (26) and the indicator 27 to the heating coil of the probe thermistor 23. Operate switch 30 to position 4. This connects the pilot controlled source 21 to the dummy load 28, it being remembered that the switches 33 and 34 are in position 2. Adjust the output of the manual source B (26) to obtain the reading $y$ on the indicator 27. The probe thermistor will now have the resistance necessary to obtain the gain for amplifier 2 which is 0.2 decibel below the value necessary to obtain the specified pilot output level. Both amplifiers are now on manual control with gains which may differ by as much as 0.5 decibel, having regard to the fact that the heating power for the probe thermistor 23 was adjusted 0.2 decibel low, and to the effect of slight differences in the characteristics of the two amplifiers.

8. The working amplifier 2 may now be replaced by the spare amplifier 9 by means of the switching process represented by the U-link system. A change in pilot level of 0.5 decibel may occur, the effect of which is practically negligible. It is now necessary to transfer control to the spare thermistor 17.

9. The pilot controlled source 21 is at this stage connected to the dummy load 28. Switch 32 should now be operated to position 4 to connect the indicator 27 across the dummy load in order to measure the output of this source, which should be adjusted to zero as before. This will generally shift the characteristic line 38 (Fig. 2) to some other position because the pilot level is changed, as already explained.

10. Operate switches 30 and 32 to position 3. This connects the source 21 and the indicator 27 to the heating coil of the spare thermistor 17. The output of the manual source B (26) should now be slowly reduced to zero, control being thereby gradually transferred to the spare thermistor 17 which is now heated from the source 21. On account of the fact that the sensitivity of the control was increased, a further reduction of 0.2 decibel in the pilot level will be produced. This low level will be indicated on the pilot deviation indicator 22, and should be corrected by re-adjusting the sensitivity of the control until the indicator 22 shows zero deviation. (This is equivalent to returning to the characteristic line 36 shown in Fig. 2.) The spare amplifier is now operating with the spare thermistor 17 under pilot control, but the control ratio is high and must be restored to normal. As a preliminary to this, the reading $z$ of the indicator should be noted, which gives the power required to be supplied to the spare thermistor 17 in order to produce the proper gain.

11. Set switches 29 and 32 in position 4. Remembering that switches 33 and 34 are in position 2, this connects the manual source A (25) and the indicator 27 to the dummy load 28. Adjust the output of the source A to give the reading $z$ on the indicator. Set switch 31 in position 1 and remove the plug 24 from the jack 18.

12. Return switches 33 and 34 to position 1. This interchanges the sources 21 and 25. The source 21 being now connected across the dummy load 28 the control ratio may be re-adjusted to the normal value. This having been done, switches 33 and 34 are again operated to position 2 so putting the spare thermistor 17 under the control of the pilot source. The spare amplifier 9 will now be working in circuit 1 under normal conditions instead of the working amplifier 2.

The arrangements which have been described with reference to Figs. 1 and 2 are designed to produce the minimum changes in level during the replacement of the working amplifier by the spare amplifier. If level changes of several decibels can be tolerated, a simpler process is possible. In this case the probe thermistor 23, the dummy load 28, and the manual power source B (26) are not required, and can be omitted. The elements 16, 18 and 24 will also be omitted and the switches can be simplified accordingly. With the switches in the position shown, the power supplied by the pilot controlled source 21 to the working thermistor 15 is measured by the indicator 27 giving the reading $x$. Switches 30 and 32 are then set to position 3, so that the manual source A and the indicator 27 are connected to the spare thermistor 17. The manual source A is then adjusted to obtain the same reading $x$. This means that the spare thermistor is now supplied with the same heating power as the working thermistor, but owing to manufacturing variations, the resulting thermistor resistances may be appreciably different. The gain of the spare amplifier 9 will, however, be roughly correct. If the U-link switches are now operated to replace the working amplifier 2 by the spare amplifier 9, a change in pilot level of several decibels may be expected. The spare amplifier 9 is at this time controlled by the manual source A (25) and in order to transfer it to pilot control the switches 33 and 34 will be operated to position 2. The change in pilot level will now be corrected by the pilot regulator.

It will thus be seen that switch 32 needs only positions 1 and 3, switches 29 and 31 are not required, and switch 30 needs only position 3 and an "off" position.

The changes in level produced by this simplified process can be reduced if each thermistor is provided with an attenuating network connected in front of the heating coil, as shown in Fig. 3. A thermistor 39 is shown with a heating coil 40, and a resistance element 41 connected to terminals 42 and 43. The heating coil, which is assumed to have a resistance $r$ (which can be made closely equal to a desired value without difficulty) is shunted by a resistor 44, and has connected in series with it a second resistor 45. These two resistors form an attenuating network. The values of these resistors will be selected so that when the particular thermistor concerned is placed in an enclosure at a given temperature, some given resistance value R will be measured at terminals 42 and 43 when a specified current I is supplied to terminals 46 and 47, and also so that the resistance measured at terminals 46 and 47 is $r$. Each individual thermistor will in general require different values for the resistors 44 and 45.

By this means the changes in level which occur during the replacing process will be reduced, but they will still be appreciably greater than the changes which occur when the preferred process employing the probe thermistor is employed, because the adjustment by the attenuating network only fixes one point on the characteristic curve of the thermistor.

For convenience, and in order to avoid mistakes, the switching operations illustrated in Fig. 1 may be carried out by one, or possibly two, multiposition switches having the necessary banks of contacts, so that the circuit for each stage in the process described may be automatically set up by rotating a switch by one step. If desired, an engraving may be supplied for each step setting out the operation to be performed when the switch is on that step. In this way the operation of the arrangement may be made practically fool-proof. It is not necessary to specify in detail the connections of such multiposition switches, as they can be readily worked out by any person skilled in the art.

While the principles of the invention have been described above in connection with specific embodiments, and particular modifications thereof, it is to be clearly understood that this description is made only by way of example and not as a limitation on the scope of the invention.

What I claim is:

1. An electric carrier current signal communication system, of the type in which one amplifier may be substituted for another without producing a transient surge during the changeover, said system comprising a working amplifier, an automatic gain control circuit for said amplifier including a thermistor, a pilot regulator including a power supply source coupled to said gain control circuit, said power source supplying heating current to said thermistor, a pilot signal transmitted with the signal currents for controlling said power supply, whereby the gain of the circuit is determined by the amount of heating current supplied to said thermistor from said power source; a spare amplifier, gain control circuit and thermistor having similar characteristics to the working counterparts, a manually adjustable power supply source coupled to said spare gain control circuit and supplying heating current to said spare thermistor, said manually adjustable power supply supplying substantially the same heating current to said spare thermistor as the pilot controlled power source supplies to said working thermistor, whereby the gain of the two circuits is made substantially the same; and means for switching the spare amplifier in place of the working amplifier.

2. An electric carrier current signal communication system of the type in which one amplifier may be substituted for another without producing a transient surge during changeover, said system comprising a working amplifier and a spare amplifier, a gain control circuit for each including a working thermistor and a spare thermistor respectively, an automatically adjustable power supply source controlled by pilot current transmitted with said signal current, said power source supplying heating current to said working thermistor, the gain of said amplifiers being determined by the amount of power supplied to said thermistors respectively, first and second manually adjustable power supply sources, a probe thermistor having substantially the same characteristics as said working and spare thermistors, means for measuring the power supplied to said working thermistor, means for manually adjusting said first power supply to supply said measured power to said probe thermistor, means for coupling said probe thermistor across said spare thermistor to establish the gain of the spare amplifier at a desired level, means for manually adjusting said second power supply to supply said measured power, means coupling said second power supply to said working thermistor so that both said amplifiers are operating at substantially the same gain, means for switching said spare amplifier in place of said working amplifier, and means for substituting said pilot controlled power supply for said second manually adjustable power supply, and means for disconnecting said first power supply from said spare thermistor.

3. A system according to claim 1, and further comprising a power indicating device coupled to either of the thermistors for measuring the heating power supplied thereto.

4. A system according to claim 2, in which the said thermistors are provided with heating coils, all having the same resistance, and further comprising a dummy load having the said resistance, a power indicating device, said switching means including means coupling the dummy load to different ones of said sources at different times whereby the sources may be adjusted to the measured level, and means coupling the indicating device to be connected to either of the three thermistors or to the dummy load for indicating the power supplied thereto by one of the power sources.

5. A system according to claim 4, in which the switching means couples one of the manually controlled sources to supply current only to the probe thermistor.

CHARLES TREVOR DALY.

References Cited in the file of this patent

UNITED STATES PATENTS

| Number | Name | Date |
|---|---|---|
| 2,396,990 | Dysart | Mar. 19, 1946 |